Aug. 22, 1961 L. C. HOLLY 2,996,800

METHOD OF MAKING OHMIC CONNECTIONS
TO SILICON SEMICONDUCTORS

Filed Nov. 28, 1956

INVENTOR
LESTER C. HOLLY

BY Stevens, Davis, Miller & Mosher
ATTORNEYS

United States Patent Office 2,996,800

Patented Aug. 22, 1961

2,996,800

METHOD OF MAKING OHMIC CONNECTIONS TO SILICON SEMICONDUCTORS

Lester C. Holly, Irving, Tex., assignor to Texas Instruments Incorporated, Dallas, Tex., a corporation of Delaware Filed Nov. 28, 1956, Ser. No. 624,818
5 Claims. (Cl. 29—494)

This invention relates to improvements in ohmic connections for silicon semiconductor devices and to a method for making such connections.

Typical of silicon semiconductor devices are silicon transistors which are comprised of a small bar of silicon about .030 by .030 inch in cross-section and about .25 inch in length. This small silicon bar has end portions of one type (p or n) of electrical conductivity and a narrow layer extending transversely somewhere near the mid-point of the opposite type of electrical conductivity. Electrical connections must be made to this intermediate layer, which is known as the base of the transistor, and to the end portions, which are known as the emitter and the collector of the transistor. Provisions for supporting and enclosing the bar are also provided.

This invention is concerned with the making of the connections to the ends of the silicon transistor bar, and since no rectification of the electrical current is desired at these points, these connections are known as ohmic or non-rectifying connections. The connection that must be made to the base layer of the bar presents its own peculiar problems, but this invention is not concerned with them.

Prior to this invention, many different methods of forming the ohmic connections at the ends of silicon transistor bars have been proposed and some of them have been commercially used. However, considerable difficulty has been encountered in making these connections because it is difficult to get any type of solder to stick to silicon metal; high temperatures tend to injure or destroy the very characteristics that it is necessary for the silicon bars to have in order for them to function as transistors; and silicon has a relatively low coefficient of expansion, whereas most metals have a much higher coefficient of expansion, so that changes in temperature of the device normally encountered in the course of affixing the ohmic contacts to the silicon bar tend to cause the contact to crack loose from the silicon.

Some success has been had in affixing ohmic connections to silicon transistor bars by electroplating the ends of the bars with rhodium or nickel and soldering a suitable connecting wire to this coating. However, the heat incident to the soldering often causes a cracking away of the contact, and sometimes damages the characteristics of the silicon bar as well.

The present invention provides a simpler, easier and quicker method for attaching electroconductive leads to the ends of silicon bars, and the attachment is accomplished without damage to the characteristics of the bars and is quite permanent.

Briefly, the present method of attaching electrical connections to the ends of silicon bars consists in soldering the connections to the bars by the use of an alloy of approximately 4% germanium and 96% silver, with the addition of a small amount of an appropriate conductivity-affecting impurity. This alloy has been found to melt at a sufficiently low temperature to be usable without damage to the semiconductor junctions, to adhere well to silicon and to have a coefficient of expansion such as will not cause the soldered connection to crack loose even under fairly wide temperature changes.

There are a number of ways in which the end connections may be soldered to the silicon bars in accordance with this invention, and, of course, the same principles may be applied to the soldering of ohmic connections to silicon diodes. It has been found desirable, in accordance with this invention, to use cesium fluoride as a solder flux. Cesium fluoride melts at 684° C. and the alloy is also molten at that temperature. As a result, it has been found desirable to accomplish the soldering at a temperature only slightly above this temperature, for example, between 684° C. and 750° C. The soldering can be accomplished at an even higher temperature, but, generally, higher temperatures are to be avoided.

The ohmic connections, in the case of transistor bars of the type described above, are preferably of gold-plated "Kovar" about .003 inch thick, .035 inch in width and .125 inch in length. "Kovar" is a trade name for an alloy of cobalt, iron and nickel, which is described in detail in United States Patent No. 1,942,260 to Scott. The solder alloy may contain about 0.6 percent antimony or some other impurity capable of inducing n-type conductivity when the connection is to be made to a portion of a silicon bar having n-type conductivity, and may contain about 0.6 percent aluminum, indium or some impurity capable of inducing p-type conductivity when the connection is to be made to a portion of a silicon bar having p-type conductivity. The soldering preferably takes place in an atmosphere of helium or some other inert gas.

In patent application Serial No. 493,478, filed March 10, 1955, by Boyd Cornelison et al., there is described in detail, and illustrated, a method of assembling and soldering together transistors of the general type to which this invention is particularly applicable. The use of the principles of this invention in the method described in detail in that application furnishes one good, specific example of the application of this method.

Another illustration of the application of the principles of this invention will be found in the accompanying drawing and in the following detailed description thereof. It is to be understood, however, that this is but one example of the numerous ways in which this invention may be put into practice.

Figure 1:
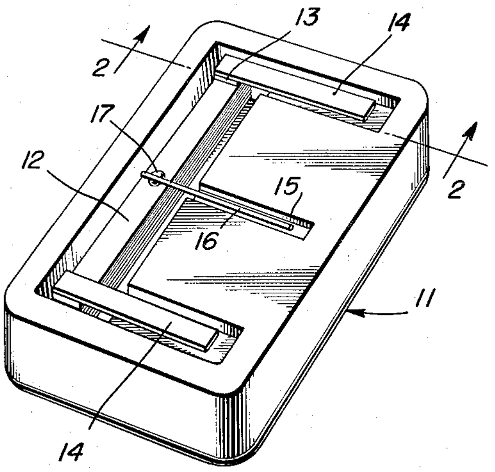
FIGURE 1 is a perspective view of a quartz boat carrying a silicon transistor bar and other parts in the position into which they are to be affixed thereto.
Figure 2:
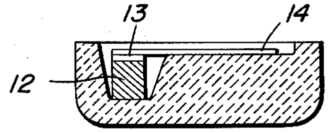
FIGURE 2 is a cross-sectional view, taken on lines 2—2 of FIGURE 1.

As illustrated in the drawing, the principles of this invention are applied by assembling the necessary parts in a quartz boat 11 especially shaped for the purpose. Graphite or other heat-resistant material may be substituted for quartz, but quartz is preferred. As illustrated in the drawing, the boat is shaped to accommodate the parts for one transistor, but it will, of course, be understood that the boat may, instead, be shaped to accommodate the parts for many transistors, as, for example, is shown in the above-mentioned Cornelison et al. patent application.

In the deepest depression in the face of the quartz boat 11, there is positioned a silicon transistor bar 12, which, as has been said, is usually about .030 by .030 by .25 inch in size. On top of this transistor bar, at each end, is placed a small piece of the solder alloy 13. This piece of solder alloy will generally be a thin, square piece of alloy about .035 by .035 inch square and about .002 inch thick. The size, however, is not critical. Assuming that the transistor bar is of the n-p-n type, the solder alloy may consist of 4% germanium, 95.4% silver and 0.6% antimony. Aluminum may be substituted for the antimony if the transistor bar is of the p-n-p type.

On top of the solder alloy, at each end of the transistor bar and extending at right angles thereof, is placed a conductor 14. Preferably, each of these conductors is made of gold-plated Kovar, but practically any other desired material may be substituted therefor. The size of the lead may vary, as desired, but strips of material .035 inch wide by .125 inch long and .003 inch in thickness have been used and found satisfactory.

The base layer connection may be made at the same time, although it need not necessarily be made then. If the base layer connection is to be made at the same time, it can be made by placing an aluminum wire 16 of about .005 inch in diameter in a groove 15 in the face of the quartz boat so that it extends at right angles to and across the upper face of the transistor bar at the base layer. Between the wire and the upper face of the transistor bar there is placed a small pellet 17 of indium, and when the assembly is subsequently heated, this indium forms a connection between the aluminum wire 16 and the p-type base layer of the transistor bar. If the transistor bar is of the p-n-p type, it will be necessary to use an n-type impurity material, such as antimony or arsenic, instead of indium, and to use a wire of tungsten or platinum, or the like, instead of aluminum.

Figure 3:
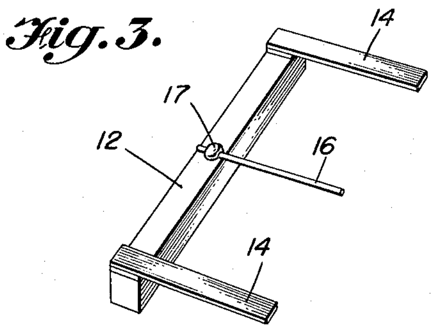
FIGURE 3 is a perspective view of a transistor bar with the leads attached to it.

Once the parts have been assembled in the boat 11, cesium fluoride flux is applied at the points where the ohmic connections are to be formed at the ends of the bar, and the assembly, in the quartz boat, is then heated in an inert atmosphere of helium to a temperature of around 700° C. This heating is continued until fusion is complete, which is only a matter of a sufficient length of time to allow the parts to become heated. The assembly is thereafter cooled and removed from the quartz boat, and appears as illustrated in FIGURE 3.

What is claimed is:

1. A method of attaching electrical connections to silicon that comprises soldering the connections to the silicon with an alloy comprising approximately 4% germanium and 96% silver, using molten cesium fluoride as the solder flux.

2. A method of attaching electrical connections to silicon that comprises soldering the connections to the silicon with an alloy comprising approximately 4% germanium and 96% silver at a temperature of around 684° C. to 750° C., using cesium fluoride as a flux, and conducting the soldering operation in an inert atmosphere.

3. A method of attaching electrical connections to silicon of a given conductivity type that comprises soldering the connections to the silicon with an alloy comprising approximately 4% germanium and 96% silver and a minor amount of an element capable of imparting the said given conductivity to silicon, using cesium fluoride as a flux, and conducting the soldering operation at a temperature of around 684° C. to 750° C. in an inert atmosphere.

4. A method as defined in claim 3 wherein said element is selected from group V of the periodic table.

5. A method as defined in claim 3 wherein said element is selected from group III of the periodic table.

References Cited in the file of this patent

UNITED STATES PATENTS

| | | |
|---|---|---|
| 2,759,133 | Mueller | Aug. 14, 1956 |
| 2,763,822 | Frola et al. | Sept. 18, 1956 |
| 2,777,101 | Cohen | Jan. 8, 1957 |
| 2,801,375 | Losco | July 30, 1957 |
| 2,807,561 | Nelson | Sept. 24, 1957 |

FOREIGN PATENTS

| | | |
|---|---|---|
| 487,597 | Great Britain | June 20, 1938 |